(12) United States Patent
Schauer et al.

(10) Patent No.: US 7,579,261 B2
(45) Date of Patent: Aug. 25, 2009

(54) EPITAXIALLY COATED SILICON WAFER AND METHOD FOR PRODUCING EPITAXIALLY COATED SILICON WAFERS

(75) Inventors: Reinhard Schauer, Laufen (DE); Norbert Werner, Tengling (DE)

(73) Assignee: Siltronic AG, Munich (DE)

( * ) Notice: Subject to any disclaimer, the term of this patent is extended or adjusted under 35 U.S.C. 154(b) by 276 days.

(21) Appl. No.: 11/521,846

(22) Filed: Sep. 15, 2006

(65) Prior Publication Data

US 2007/0066036 A1 Mar. 22, 2007

(30) Foreign Application Priority Data

Sep. 22, 2005 (DE) .................. 10 2005 045 339

(51) Int. Cl.
*H01L 2/01* (2006.01)
(52) U.S. Cl. .................. 438/478; 438/492; 438/905; 257/E21.214
(58) Field of Classification Search .................. 438/478, 438/492, 905
See application file for complete search history.

(56) References Cited

U.S. PATENT DOCUMENTS

| | | | |
|---|---|---|---|
| 5,400,548 A | 3/1995 | Huber et al. | |
| 6,030,887 A * | 2/2000 | Desai et al. | ................. 438/507 |
| 6,277,715 B1 | 8/2001 | Takeno et al. | |
| 6,478,883 B1 | 11/2002 | Tamatsuka et al. | |
| 6,899,762 B2 | 5/2005 | Wenski et al. | |
| 2001/0032581 A1 | 10/2001 | Wilson et al. | |
| 2001/0039917 A1 | 11/2001 | Arai et al. | |
| 2002/0022351 A1 | 2/2002 | Schmolke et al. | |
| 2003/0068502 A1 | 4/2003 | Togashi et al. | |
| 2003/0104222 A1 | 6/2003 | Ono et al. | |
| 2003/0175532 A1 | 9/2003 | Asayama et al. | |
| 2004/0005777 A1 | 1/2004 | Qu et al. | |
| 2004/0065250 A1 | 4/2004 | Komiya et al. | |
| 2004/0089225 A1 | 5/2004 | Ono et al. | |
| 2004/0115941 A1 * | 6/2004 | Siebert et al. | ................ 438/689 |

(Continued)

FOREIGN PATENT DOCUMENTS

DE 19833257 C1 9/1999

(Continued)

OTHER PUBLICATIONS

English Abstract corresponding to JP 2003309707 A.

(Continued)

*Primary Examiner*—Davienne Monbleau
*Assistant Examiner*—Hajar Kolahdouzan
(74) *Attorney, Agent, or Firm*—Brooks Kushman P.C.

(57) ABSTRACT

A multiplicity of silicon wafers polished at least on their front sides are provided and successively coated individually in an epitaxy reactor by a procedure whereby one of the wafers is placed on a susceptor in the epitaxy reactor, is pretreated under a hydrogen atmosphere at a first hydrogen flow rate, and with addition of an etching medium to the hydrogen atmosphere at a reduced hydrogen flow rate in a second step, is subsequently coated epitaxially on its polished front side, and removed from the reactor. An etching treatment of the susceptor follows a specific number of epitaxial coatings. Silicon wafers produced thereby have a global flatness value GBIR of 0.07-0.3 μm relative to an edge exclusion of 2 mm.

12 Claims, 6 Drawing Sheets

U.S. PATENT DOCUMENTS

| | | |
|---|---|---|
| 2004/0135208 A1 | 7/2004 | Tanahashi et al. |
| 2004/0241992 A1 | 12/2004 | Kono et al. |
| 2005/0087830 A1 | 4/2005 | Takeno |
| 2005/0160971 A1 | 7/2005 | Otsuka |
| 2006/0201413 A1 | 9/2006 | Nishizawa |

FOREIGN PATENT DOCUMENTS

| | | |
|---|---|---|
| DE | 19938340 C1 | 2/2001 |
| DE | 10025871 A1 | 12/2001 |
| DE | 10316214 A1 | 11/2004 |
| EP | 272531 A1 | 6/1988 |
| EP | 547894 A1 | 6/1993 |
| EP | 580162 A1 | 1/1994 |
| JP | 2003 163216 A | 6/2003 |
| JP | 2003 309707 A | 10/2003 |
| JP | 2003 318109 A | 11/2003 |
| JP | 2004 175658 A | 6/2004 |
| JP | 165489 A | 6/2004 |
| JP | 2004 335528 A | 11/2004 |
| JP | 2004 356416 A | 12/2004 |
| JP | 2005 011880 A | 1/2005 |
| JP | 2005 39111 A | 2/2005 |
| JP | 2005 197278 A | 7/2005 |
| TW | 1227286 | 8/1988 |
| TW | 1228549 | 3/2005 |
| WO | WO 03/044845 A1 | 5/2003 |
| WO | WO 2005/001916 A1 | 1/2005 |

OTHER PUBLICATIONS

English Abstract corresponding to JP 2003318109 A.
English Abstract corresponding to JP 2003163216 A.
English Abstract corresponding to JP 2004335528 A.
English Abstract corresponding to JP 2004356416 A.
English Abstract corresponding to JP 2005039111 A.
English Abstract corresponding to JP 2005197278 A.
English Abstract corresponding to JP 2005011880 A.
English Abstract corresponding to JP 2004165489 A.
English Abstract corresponding to WO 03/044845 A1.
U.S. Publication No. 2004/0089225A1 is the English equivalent to JP 2004175658 A.
U.S. Patent No. 6,478,883 B1 is the English equivalent to TW 1227286, Nov. 12, 2002.
U.S. Publication No. 2001/0032581 A1 is the English equivalent to TW 1228549, Oct. 25, 2001.
English Derwent Abstract AN1999-519699 corresponding to DE19833257 C1.
English Derwent Abstract AN2004-786383 corresponding to DE10316214 A1.

\* cited by examiner

EPITAXIALLY COATED SILICON WAFER AND METHOD FOR PRODUCING EPITAXIALLY COATED SILICON WAFERS

BACKGROUND OF THE INVENTION

1. Field of the Invention

The invention relates to an epitaxially coated silicon wafer and to a method for producing epitaxially coated silicon wafers.

2. Background Art

Epitaxially coated silicon wafers are suitable for use in the semiconductor industry, in particular for the fabrication of large scale integrated electronic components such as microprocessors or memory chips. Stringent requirements with respect to global and local flatness, thickness distribution, single-side-referenced local flatness (nanotopology) and freedom from defects are required of the starting materials (substrates) for modern microelectronics.

Global flatness relates to the entire surface of a semiconductor wafer minus a defined edge exclusion. It is described by the GBIR, or "global backsurface-referenced ideal plane/range", the magnitude of the positive and negative deviation from a backside-referenced ideal plane for the entire front side of the semiconductor wafer, which roughly corresponds to the TTV ("total thickness variation") specification that was formerly customary.

The LTV ("local thickness variation") specification that was formerly customary is nowadays designated according to the SEMI standard by SBIR, the "site backsurface-reference ideal plane/range", or magnitude of the positive and negative deviation from a backside-referenced ideal plane for an individual component area with a defined dimension, and thus corresponds to the GBIR or TTV of a component area ("site"). Therefore, in contrast to the global flatness GBIR, the SBIR is referenced to defined fields on the wafer, that is to say for example to segments of an area grid of measurement windows having a size of 26×8 mm² (site geometry). The maximum site geometry value $SBIR_{max}$ specifies the maximum SBIR value for the component areas taken into account on a silicon wafer.

Maximum site-referenced flatness or geometry values such as the $SBIR_{max}$ are usually determined taking into account a defined edge exclusion(EE="edge exclusion") of 3 mm, by way of example. The area on a silicon wafer within the nominal edge exclusion is usually referred to as the "Fixed Quality Area", abbreviated to FQA. Those sites which have part of their area lying outside the FQA, but the center of which lies within the FQA, are called "partial sites". The determination of the maximum local flatness often does not involve using the "partial sites", but rather only the so-called "full sites", that is to say the component areas lying completely within the FQA. In order to be able to compare maximum flatness values, it is essential to specify the edge exclusion and thus the size of the FQA, and furthermore to specify whether or not the "partial sites" have been taken into account.

Furthermore, with regard to optimizing costs, it is frequently customary nowadays, not to reject a silicon wafer owing, for example, only to a component area that exceeds the $SBIR_{max}$ value specified by the component manufacturer, but rather to permit a defined percentage, e.g. 1%, of component areas with higher values. The percentage of the sites which lie or are permitted to lie below a specific limit value of a geometry parameter is usually specified by a PUA ("Percent Useable Area") value, which, e.g. in the case of an $SBIR_{max}$ of less than or equal to 0.7 μm and a PUA value of 99%, requires that 99% of the sites have an $SBIR_{max}$ of less than or equal to 0.7 μm while higher SBIR values are also permitted for 1% of the sites ("chip yield").

According to the prior art, a silicon wafer can be produced by a process sequence of separating a single crystal of silicon into wafers, rounding the mechanically sensitive edges, and carrying out an abrasive step such as grinding or lapping followed by polishing. EP 547894 A1 describes a lapping method, while grinding methods are claimed in the applications EP 272531 A1 and EP 580162 A1.

The final flatness is generally produced by the polishing step, which may be preceded, if appropriate, by an etching step for removing disturbed crystal layers and for removing impurities. A suitable etching method is known from DE 19833257 C1, by way of example. Traditional single-side polishing methods generally lead to poorer plane-parallelisms, as compared to polishing methods acting on both sides ("double side polishing"), which make it possible to produce silicon wafers with improved flatness. In the case of polished silicon wafers, therefore, every attempt is made to achieve the required flatness by suitable processing steps such as grinding, lapping and polishing.

However, the polishing of a silicon wafer usually gives rise to a decrease in the thickness of the planar silicon wafer toward the edge ("edge roll-off"). Etching methods also tend to attack the silicon wafer to a greater extent at the edge, and therefore also produce such an edge roll-off. In order to counteract these tendencies, it is customary for silicon wafers to be polished concavely. A concavely polished silicon wafer is thinner in the center, increases in thickness toward the edge, and then has a decrease in thickness in an outer edge region.

DE 19938340 C1 describes depositing a monocrystalline layer on monocrystalline silicon wafers, the layer being of silicon with the same crystal orientation as the wafer, a so-called epitaxial layer, on which semiconductor components are later fabricated. Systems of this type have certain advantages over silicon wafers made of homogeneous material, for example the prevention of charge reversal in bipolar CMOS circuits followed by short circuiting of the component ("latch-up"); lower defect densities, for example reduced number of COPs ("crystal-originated particles"); and also the absence of an appreciable oxygen content, which precludes short-circuiting risk due to oxygen precipitates in component-relevant regions.

According to the prior art, epitaxially coated silicon wafers are produced from suitable intermediates by means of a process sequence of removal polishing—final polishing—cleaning—epitaxy.

DE 10025871 A1, for example, discloses a method for producing a silicon wafer with an epitaxial layer deposited on the front side, the method comprising the following process steps:

(a) a removal polishing step as sole polishing step;
(b) (hydrophilic) cleaning and drying of the silicon wafer;
(c) pretreatment of the front side of the silicon wafer at a temperature of 950 to 1250 degrees Celsius in an epitaxy reactor; and
(d) deposition of an epitaxial layer on the front side of the pretreated silicon wafer.

It is customary, in order to protect silicon wafers from particle loading, to subject the silicon wafers to a hydrophilic cleaning after polishing. Such hydrophilic cleaning produces native oxide on the front and rear sides of the silicon wafer which is very thin: approximately 0.5-2 nm, depending on the type of cleaning and measurement. This native oxide is removed in the course of pretreatment in an epitaxy reactor under a hydrogen atmosphere (also called $H_2$ bake).

In a second step, the surface roughness of the front side of the silicon wafer is reduced and polishing defects are removed from the surface by etching, usually employing rather small amounts of an etching medium. For example, gaseous hydrogen chloride (HCl), may be added to the hydrogen atmosphere for a period of time.

Occasionally, besides an etching medium such as HCl, a silane compound, for example silane ($SiH_4$), dichlorosilane ($SiH_2Cl_2$), trichlorosilane (TCS, $SiHCL_3$) or tetrachlorosilane ($SiCl_4$), is also added to the hydrogen atmosphere in an amount such that silicon deposition and silicon etching removal are in equilibrium. Both reactions proceed at a sufficiently high reaction rate, however, so that silicon on the surface is mobile, the surface is smoothed, and defects are removed at the surface.

Epitaxy reactors, which are used in particular in the semiconductor industry for the deposition of an epitaxial layer on a silicon wafer, are described in the prior art. During all coating or deposition steps, one or more silicon wafers are heated in the epitaxy reactor by means of heating sources, preferably by means of upper and lower heating sources, for example lamps or lamp banks, and subsequently exposed to a gas mixture comprising a source gas, a carrier gas and, if appropriate, a doping gas.

A susceptor, which comprises graphite, SiC or quartz, for example, serves as a support for the silicon wafer in a process chamber of the epitaxy reactor. During the deposition process, the silicon wafer rests on this susceptor or in milled-out portions of the susceptor in order to ensure uniform heating and to protect the rear side of the silicon wafer, on which there is usually no deposition, from the source gas. In accordance with the prior art, the process chambers are designed for one or more silicon wafers.

In the case of silicon wafers having relatively large diameters, for example greater than or equal to 150 mm, single wafer reactors are usually used and the silicon wafers are processed individually since this results in a good epitaxial layer thickness regularity. The uniformity of the layer thickness can be established by various measures, for example by altering the gas flows ($H_2$, $SiHCl_3$), by incorporating and adjusting gas inlet devices (injectors), by changing the deposition temperature, or by modifications to the susceptor.

In epitaxy, it is furthermore customary, after one or more epitaxial depositions on silicon wafers, to carry out an etching treatment of the susceptor without a substrate, during the course of which the susceptor and also other parts of the process chamber are freed of silicon deposits. This etch, using hydrogen chloride (HCl), for example, is often carried out after the processing of only a small number of silicon wafers, for example 1 to 5 silicon wafers, in the case of single wafer reactors, and is often delayed until after the processing of a greater number of silicon wafers, for example 10 to 20 silicon wafers, when of depositing thin epitaxial layers. Usually, only an HCl etching treatment or else an HCl etching treatment followed by brief coating of the susceptor is carried out.

The production of epitaxially coated silicon wafers with good global flatness proves to be extremely difficult since, as mentioned above, a concavely polished silicon wafer is usually present as the substrate. In the prior art, after the epitaxy, the global flatness and also the local flatness of the epitaxially coated silicon wafer have usually deteriorated compared with those of the concavely polished silicon wafer. This is associated, inter alia, with the fact that the deposited epitaxial layer itself also has a certain irregularity.

Deposition of a thicker epitaxial layer in the center of the concavely polished silicon wafer, where the thickness decreases outwardly toward the edge of the wafer could compensate for the originally concave form of the silicon wafer and thus also improve global flatness of the wafer. However, such a non-uniform deposition is not considered in the epitaxy of silicon wafers since an important specification of an epitaxially coated silicon wafer, namely a limit value for a regularity of the epitaxial layer, will be exceeded.

SUMMARY OF THE INVENTION

An object of the invention was to provide a method for epitaxially coating silicon wafers which makes it possible to provide epitaxially coated wafers having improved global flatness. These and other objects are achieved by a method for producing epitaxially coated silicon wafers, comprising providing a multiplicity of silicon wafers polished at least on their front sides, and successively and individually coating each wafer in an epitaxy reactor by a procedure in which a respective one of the silicon wafers is placed on a susceptor in the epitaxy reactor, is pretreated under a hydrogen atmosphere at a first hydrogen flow rate in a first step, and with addition of an etching medium to the hydrogen atmosphere at a reduced hydrogen flow rate in a second step, is subsequently coated epitaxially on its polished front side and is then removed from the epitaxy reactor, and furthermore an etching treatment of the susceptor is effected after a specific number of epitaxial coatings.

DETAILED DESCRIPTION OF THE PREFERRED EMBODIMENT(S)

In the method according to the invention, first, a multiplicity of silicon wafers which are polished at least on their front sides are provided. For this purpose, a silicon single crystal produced according to the prior art, preferably by crucible pulling according to Czochralski, may be sawn into a multiplicity of silicon wafers by means of known separation methods, preferably by wire sawing with free ("slurry") or bonded grain (diamond wire). Furthermore, mechanical processing steps are effected, such as sequential single-side grinding methods (SSG), simultaneous double-side grinding method ("double-disk grinding" DDG) or lapping. The edge of the silicon wafer including optionally present mechanical markings such as an orientation notch or an essentially rectilinear flattening of the silicon wafer edge ("flat") is generally processed as well (edge rounding, "edge-notch-grinding"). Chemical treatment steps comprising cleaning and etching steps are additionally provided.

After the grinding, cleaning and etching steps, the surfaces of the silicon wafers are smoothed by removal polishing. In the case of single-side polishing (SSP), silicon wafers are held during processing on the rear side on a carrier plate by means of cement, by vacuum or by means of adhesion. In the case of double-side polishing (DSP), silicon wafers are inserted loosely into a thin toothed disk and polished on the front and rear side simultaneously in a manner "floating freely" between an upper and a lower polishing plate covered with a polishing cloth.

The front sides of the silicon wafers are then preferably polished in a haze-free manner, for example using a soft polishing cloth with the aid of an alkaline polishing sol. In order to obtain the desired flatness of the silicon wafers produced up to this step, the material removals are relatively small, preferably 0.05 to 1.5 μm. This step is often referred to as CMP polishing (chemo-mechanical polishing) in the literature. The silicon wafers provided are preferably polished concavely in order to restrict the edge roll-off caused by polishing steps (and also etching steps) to an outer edge region of the silicon wafer. The global flatness value GBIR of the silicon wafers provided is usually 0.3-0.5 μm given an edge exclusion of 2 mm.

After polishing, the silicon wafers are subjected to a hydrophilic cleaning and drying according to the prior art. The cleaning may be performed either as a batch method with simultaneous cleaning of a multiplicity of silicon wafers in baths, by spraying methods, or else as a single wafer process.

The silicon wafers provided are preferably wafers made of monocrystalline silicon material, SOI ("silicon-on-insulator") wafers, silicon wafers with strained silicon layers ("strained silicon") or sSOI ("strained silicon-on-insulator") wafers. Methods for producing SOI or sSOI wafers such as the SmartCut® process and methods for producing wafers with strained silicon layers are known in the prior art.

The polished silicon wafers provided are subsequently pretreated individually in an epitaxy reactor. The pretreatment comprises a treatment of the silicon wafer in a hydrogen atmosphere ($H_2$ bake) and a treatment of the silicon wafer with addition of an etching medium to the hydrogen atmosphere, preferably in each case within a temperature range of 950 to 1200° C. The etching medium is preferably hydrogen chloride (HCl).

The pretreatment in a hydrogen atmosphere is preferably effected at a hydrogen flow rate of 20-100 slm (standard liter per minute), more preferably 40-60 slm. The duration of pretreatment in a hydrogen atmosphere is preferably for a finite time within the range of 0-120 s.

During pretreatment with the etching medium, HCl is preferably added to the hydrogen atmosphere, preferably in an amount within the range of 5-20% by volume, such that the removal rate is 0.01-0.2 μm/min. Furthermore, during pretreatment with addition of the etching medium to the hydrogen atmosphere, the hydrogen flow rate is significantly reduced in comparison with the $H_2$ bake pretreatment. The hydrogen flow rate is preferably reduced to 0.5-10 slm. A reduction of the hydrogen flow rate to 0.5-5 slm is particularly preferred.

It has been shown that the global flatness of an epitaxially coated silicon wafer can be significantly improved by the reduction of the hydrogen flow rate during the pretreatment with the etching medium. As a result of the reduction of the hydrogen flow rate during the HCl etching step, the thickness of the silicon wafer is reduced to a greater extent at the edge than in the direction of a center of the silicon wafer. This counteracts the concave initial geometry of the silicon wafer.

Whereas no increased material removal is observed at the edge of the silicon wafer at an $H_2$ flow rate of 50 slm (standard liter per minute) during etching, that is to say the customary HCl concentration, a material removal of 100-300 nm occurs at the edge of the silicon wafer as a result of a reduction of the $H_2$ flow rate to 0.5-10 slm, that is to say with a significantly increased HCl concentration, depending on the duration of the treatment with HCl. A treatment duration of 10-120 s is therefore preferred during the HCl etching treatment, depending on the desired material removal at the edge of the silicon wafer to be epitaxially coated.

The particular advantage of this method is that after the pretreatment steps the silicon wafer obtains an optimum form of the front side for the subsequent deposition of an epitaxial silicon layer since the silicon wafer is leveled in its edge region by the pretreatment, which at least partially compensates for the concave form of the silicon wafer.

After the pretreatment steps, an epitaxial layer is deposited at least on the polished front side of at least the silicon wafer. For this purpose, a silane source as source gas is added to hydrogen as carrier gas. The epitaxial layer is deposited at a temperature of 900-1200° C. depending on the silane source used. Trichlorosilane (TCS) is preferably used as the silane source, at a deposition temperature of 1050-1150° C., and the thickness of the deposited epitaxial layer is preferably 0.5-5 μm. After the deposition of the epitaxial layer, the epitaxially coated silicon wafer is removed from the epitaxy reactor.

After a specific number of epitaxial depositions on silicon wafers, the susceptor is treated with an etching medium, preferably with HCl, in order to free the susceptor of silicon deposits, for example. A susceptor etching is preferably effected in each case after 1 to 5 epitaxial coatings of silicon wafers. For this purpose, the epitaxially coated silicon wafer is removed and the substrate-free susceptor is treated with HCl. Preferably, besides the susceptor surface, the entire process chamber is flushed with hydrogen chloride in order to remove silicon deposits.

The susceptor is preferably coated with silicon after the susceptor etching and before further epitaxial processes. This may be advantageous since the silicon wafer to be epitaxially coated does not then bear directly on the susceptor.

Moreover, it has been shown that the method according to the invention is suitable for producing a silicon wafer which comprises a front side and a rear side, at least its front side being polished and an epitaxial layer being applied at least on its front side, and which has a global flatness value GBIR of 0.07-0.3 μm, relative to an edge exclusion of 2 mm.

The silicon wafer, which has been subjected to a hydrophilic cleaning after the polishing of at least its front side, as a result of which a native oxide layer forms on the silicon wafer, is pretreated in a hydrogen atmosphere in an epitaxy reactor in order to remove native oxide from the silicon wafer, and subsequently treated with addition of hydrogen chloride to the hydrogen atmosphere in a second step, the hydrogen flow rate having been significantly reduced in the second step in order to remove silicon material in a targeted manner in the edge region of the silicon wafer, to at least partly compensate for the concave initial geometry of the polished silicon wafer and to give the silicon wafer a flatter geometric form, and then is provided with an epitaxial layer at least on its front side after the pretreatment steps.

In the course of a series of measurements with silicon wafers epitaxially coated in accordance with the invention, with the hydrogen flow rate in each case having been reduced to 0.5-10 slm according to the invention during the pretreatment in the etching medium, the following values, inter alia, arose for the global flatness value GBIR given treatment durations of 10-120 s: 0.11 μm; 0.15 μm; 0.17 μm; 0.25 μm; and 0.29 μm, in each case with an edge exclusion of 2 mm.

The silicon wafer according to the invention preferably has a global flatness value GBIR of 0.07-0.25 μm. It has been shown that a further improvement of the global flatness values of the epitaxially coated silicon wafers is achieved by a reduction of the hydrogen flow rate to 5 slm or less.

In the course of a series of measurements with silicon wafers epitaxially coated in accordance with the invention, with the hydrogen flow rate having been reduced to 5 slm during pretreatment in the etching medium (compared with a flow rate of 50 slm during the $H_2$ bake), the following values, inter alia, arose for the global flatness value GBIR: 0.07 μm; 0.09 μm; 0.12; 0.14 μm, in each case with an edge exclusion of 2 mm (note the example). Therefore, the epitaxially coated silicon wafer preferably has a GBIR of 0.07-0.15 μm, likewise with an edge exclusion of 2 mm.

The silicon wafer is preferably a wafer made of monocrystalline silicon material, an SOI ("silicon-on-insulator") wafer, a silicon wafer with a strained silicon layer ("strained silicon") or an sSOI ("strained silicon-on-insulator") wafer provided with an epitaxial layer.

The GBIR values of the silicon wafer according to the invention of less than or equal to 0.3 μm already meet the requirements made of starting materials for the next technology generation (according to ITRS: hp45 technology node) and the subsequent generation (hp32 technology node), as prepared in the reactor by the process steps described herein. This also applies to the local flatness, expressed by the $SBIR_{max}$, which, in the case of the silicon wafer according to the invention, is less than or equal to 0.1 μm, preferably less than or equal to 0.05 μm, likewise with an edge exclusion of 2 mm, and relative to partial regions of an area grid of segments having a size of 26×8 mm². This results in 336 segments, of which 52 are "partial sites". The "partial sites" are preferably taken into account in the determination of the $SBIR_{max}$. The PUA value is preferably 100%.

EXAMPLE

An epitaxial layer was deposited on a silicon wafer having a diameter of 300 mm that had been polished by means of CMP on its front side, in accordance with the prior art. The silicon wafer was concavely polished, that is to say had a concave initial geometry and an edge roll-off. During pretreatment of this silicon wafer in the epitaxy reactor, first, a pretreatment in a hydrogen atmosphere was effected at an $H_2$ flow rate of 50 slm.

During a subsequent pretreatment, with hydrogen chloride added into the hydrogen atmosphere, the $H_2$ flow rate was reduced according to the invention, to 5 slm. The duration of the pretreatment with hydrogen chloride was 60 s. An epitaxial layer was subsequently deposited at a deposition temperature of 1120° C. and a trichlorosilane flow rate of 17 slm. The results are explained below with reference to FIGS. 1 to 6, whereas FIGS. 2, 4 and 6 show schematically the geometry of the circular silicon wafers in perspective.

Figure 1:
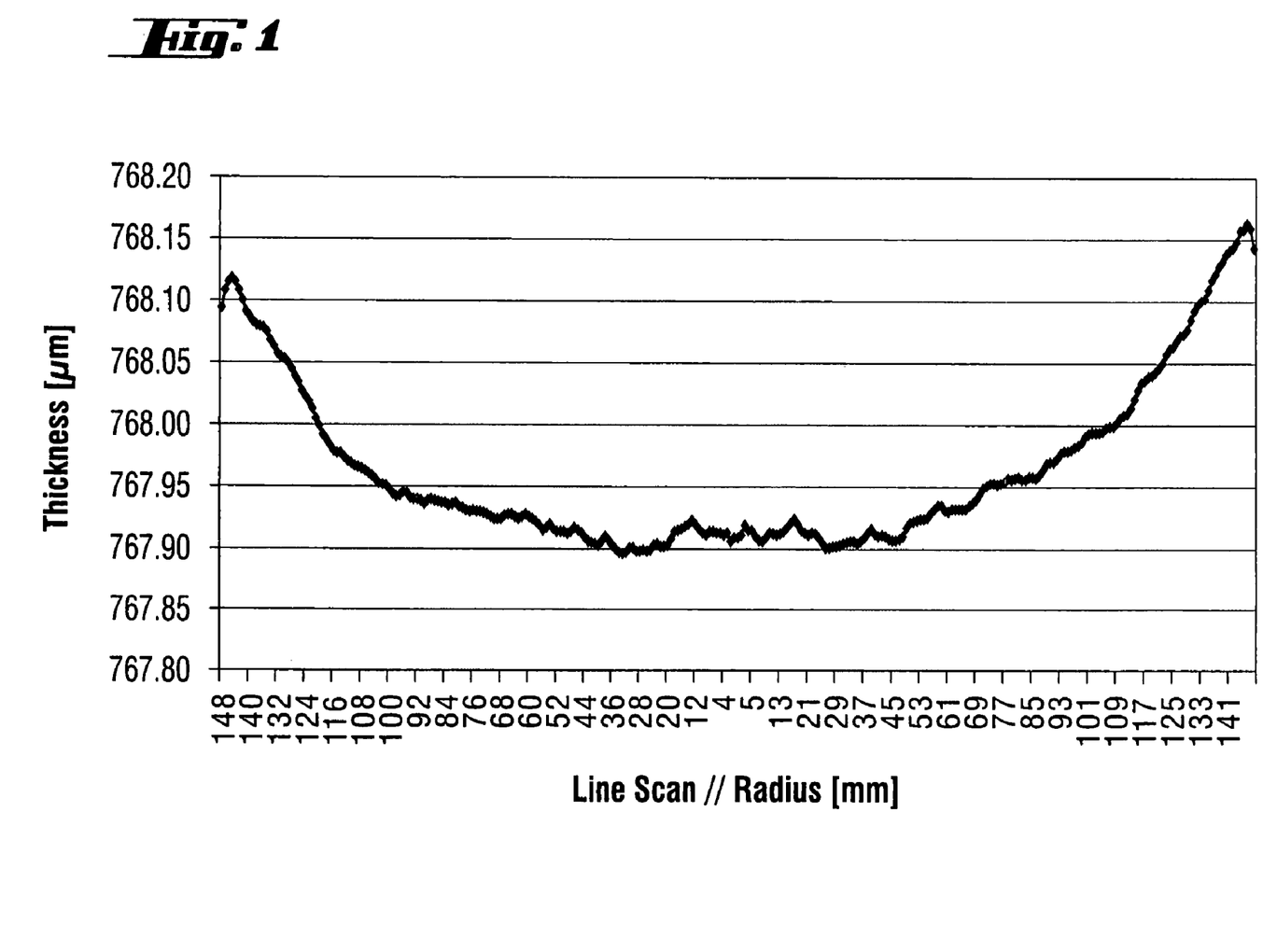
FIG. 1 illustrates a profile of the thickness of a concavely polished silicon wafer against its diameter ("line scan").

FIG. 1 illustrates the thickness distribution of a concavely polished silicon wafer having a diameter of 300 mm of −148 mm to +148 mm as a function of radius, as a line scan. An edge exclusion of 2 mm is taken as a basis here. The thickness increases from the center in the direction of the edge and exhibits a significant decrease at the edge.

A global flatness value GBIR of 0.3 μm results given an edge exclusion of 2 mm.

Figure 2:
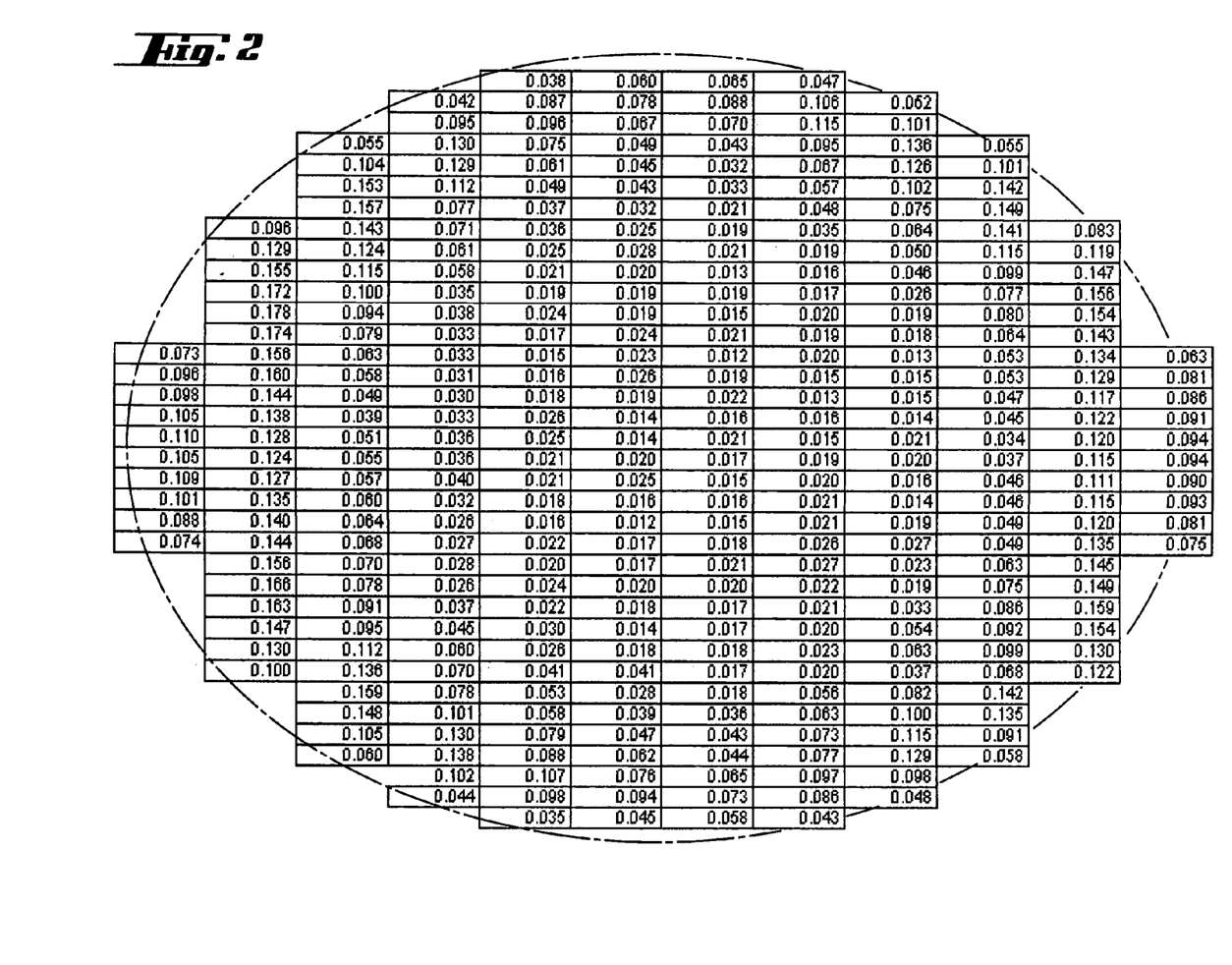
FIG. 2 shows SBIR values for this concavely polished silicon wafer.

FIG. 2 illustrates site geometry values SBIR for this concavely polished silicon wafer given a subdivision into 336 component areas ("sites") having a size of 26×8 mm². 52 of these 336 component areas are "partial sites". Using an edge exclusion of 2 mm or an FQA of 296 mm and taking account of all the "partial sites", a maximum site geometry value $SBIR_{max}$ of 0.174 μm results in this case.

Figure 3:
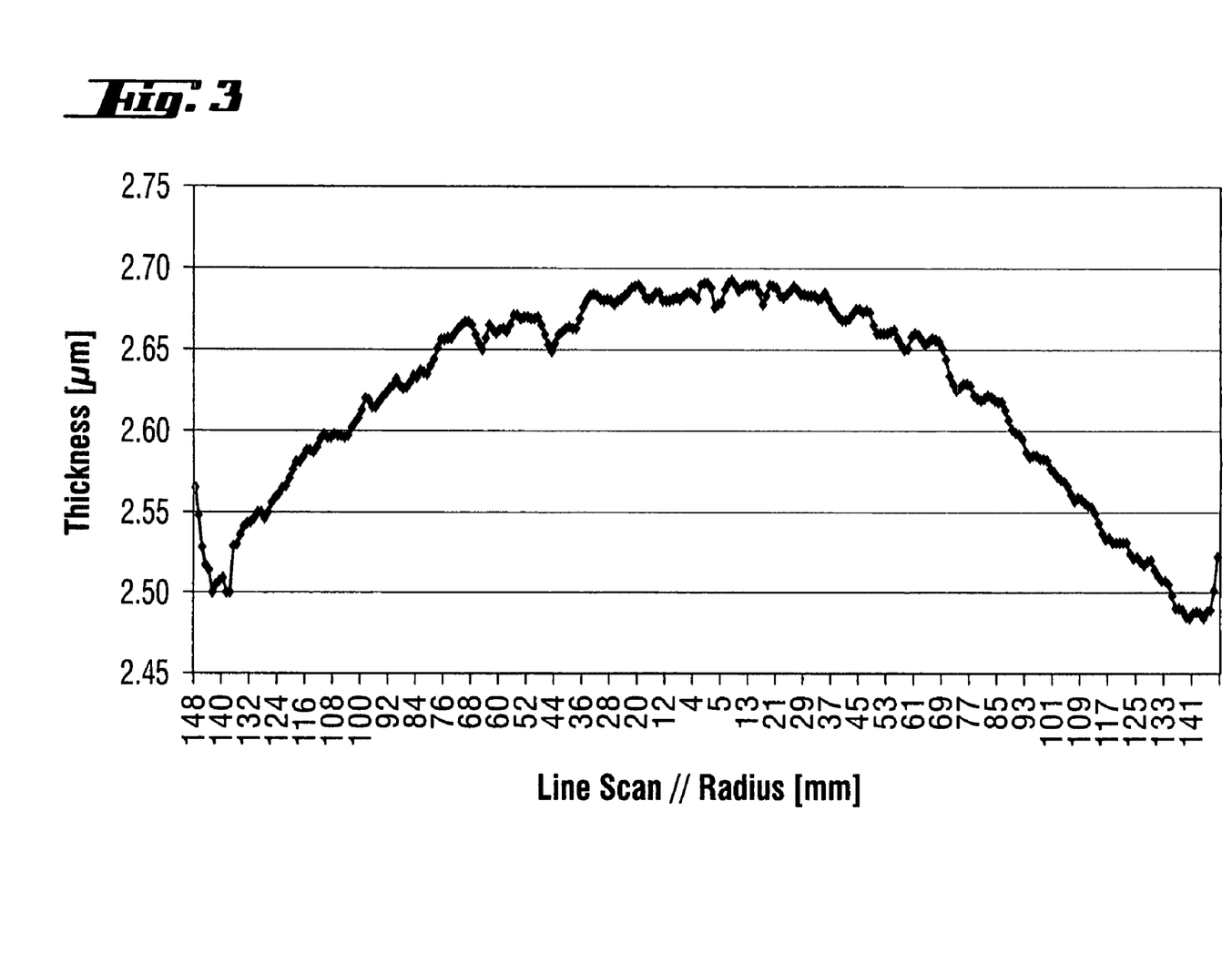
FIG. 3 shows the thickness of the epitaxial layer against a line scan.
Figure 4:
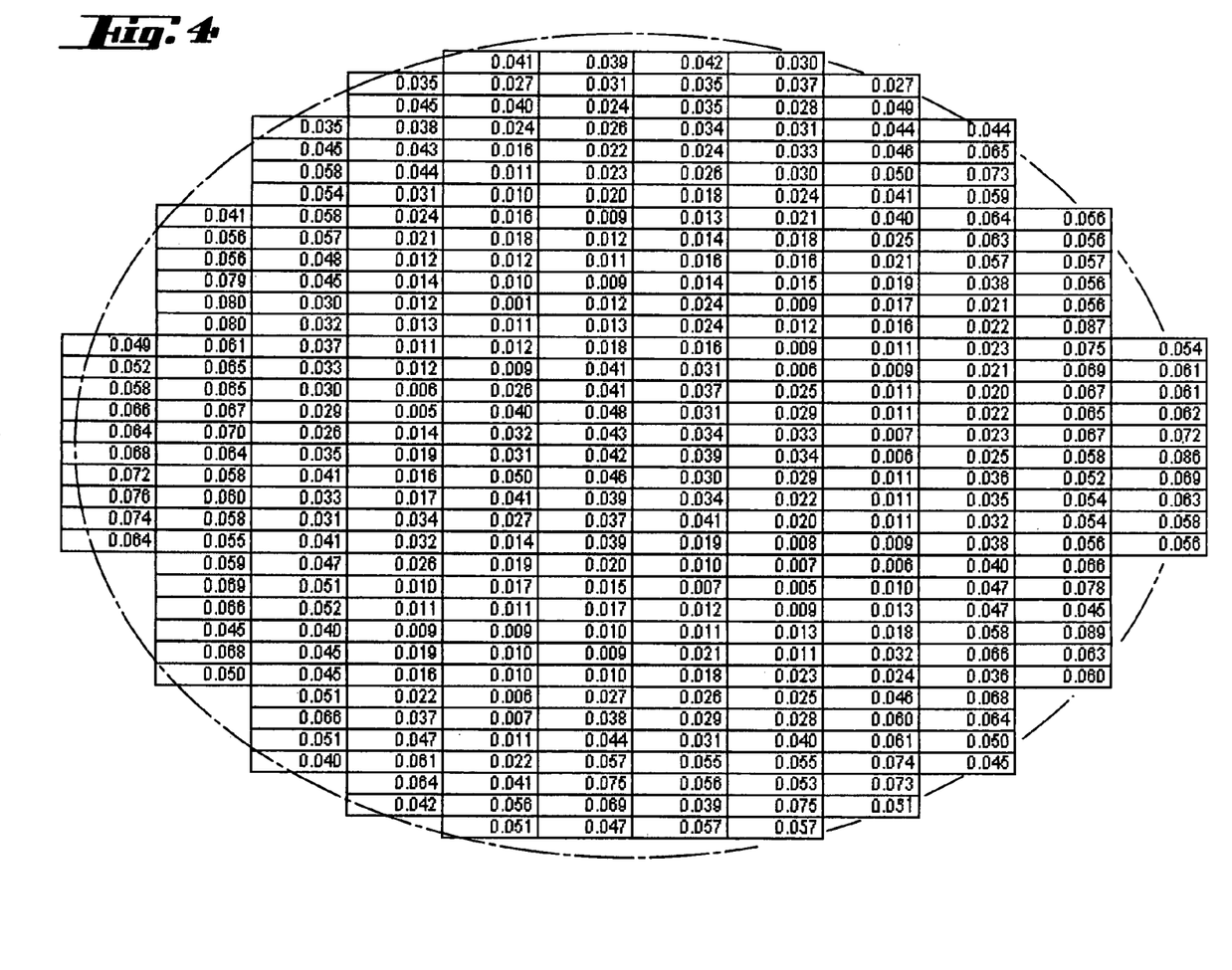
FIG. 4 shows SBIR values for the epitaxially coated silicon wafer.

FIG. 3 illustrates the difference in thickness between the epitaxially coated silicon wafer and the concavely polished silicon wafer as a function of radius, as a line scan. This difference in thickness decreases from the center in the direction of the edge of the wafer and rises again in the edge region, but does not correspond to the actual thickness of the deposited epitaxial layer, but rather also takes account of the changes in thickness as a result of pretreatment steps. Since material was removed at the edge of the silicon wafer during the pretreatment with the etching medium, significantly more silicon than illustrated in FIG. 3 was accordingly deposited at the edge. The material removal at the edge was approximately 150-200 nm, which was then overgrown by a uniform epitaxial layer having a thickness of 2.6 μm±1.5%. This complies with a specification for the layer thickness regularity of the epitaxial layer.

FIG. 4 reveals SBIR values of the epitaxially coated silicon wafer. There is a significant improvement in the site geometry values in comparison with the concavely polished silicon wafer. An $SBIR_{max}$ of 0.086 μm results here, once again for 336 sites having a size of 26×8 mm², 52 thereof being "partial sites" which were likewise taken into account, and with an edge exclusion of 2 mm or an FQA of 296 mm.

Figure 5:
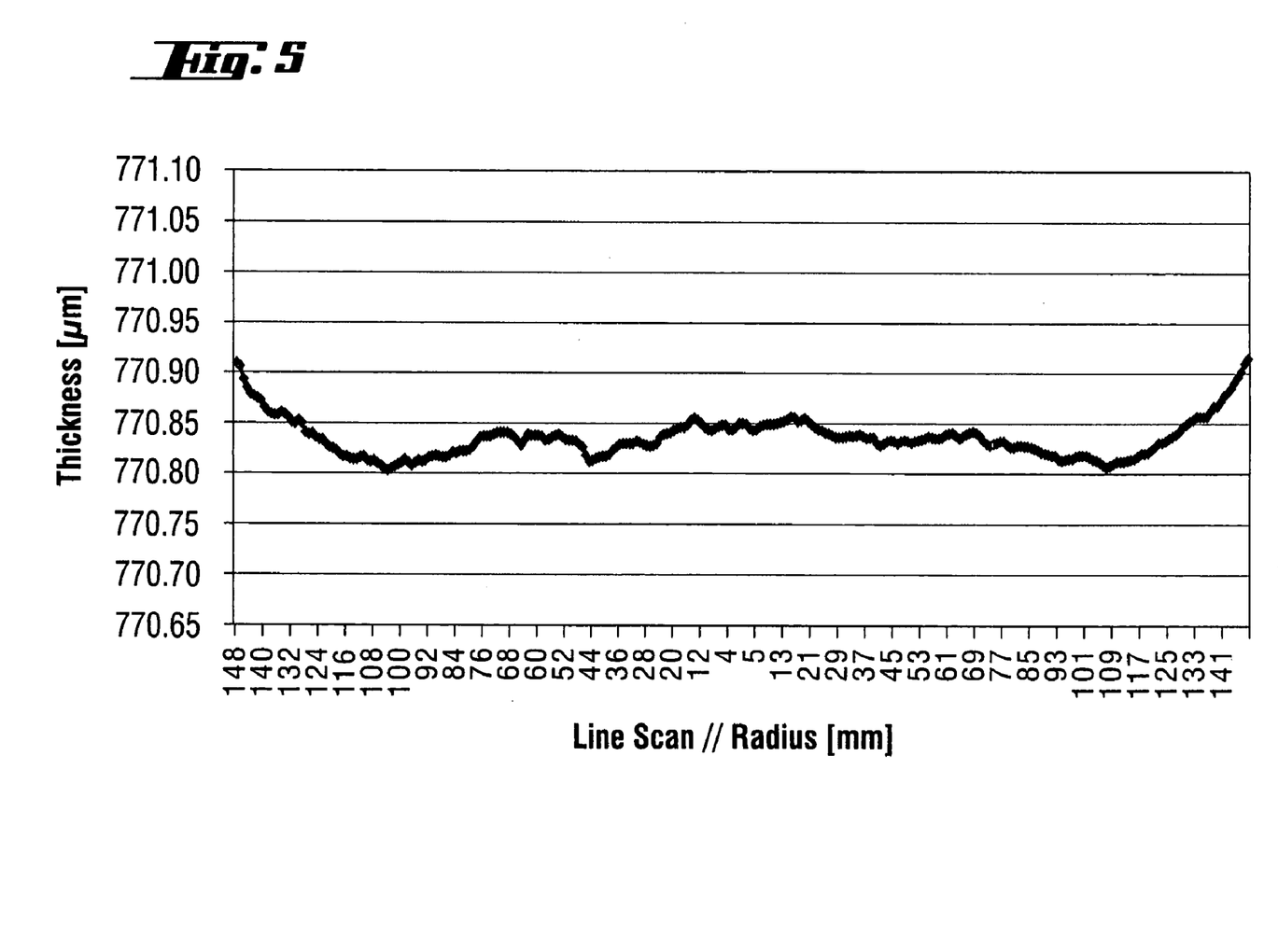
FIG. 5 shows the thickness of the epitaxially coated silicon wafer against a line scan.
Figure 6:
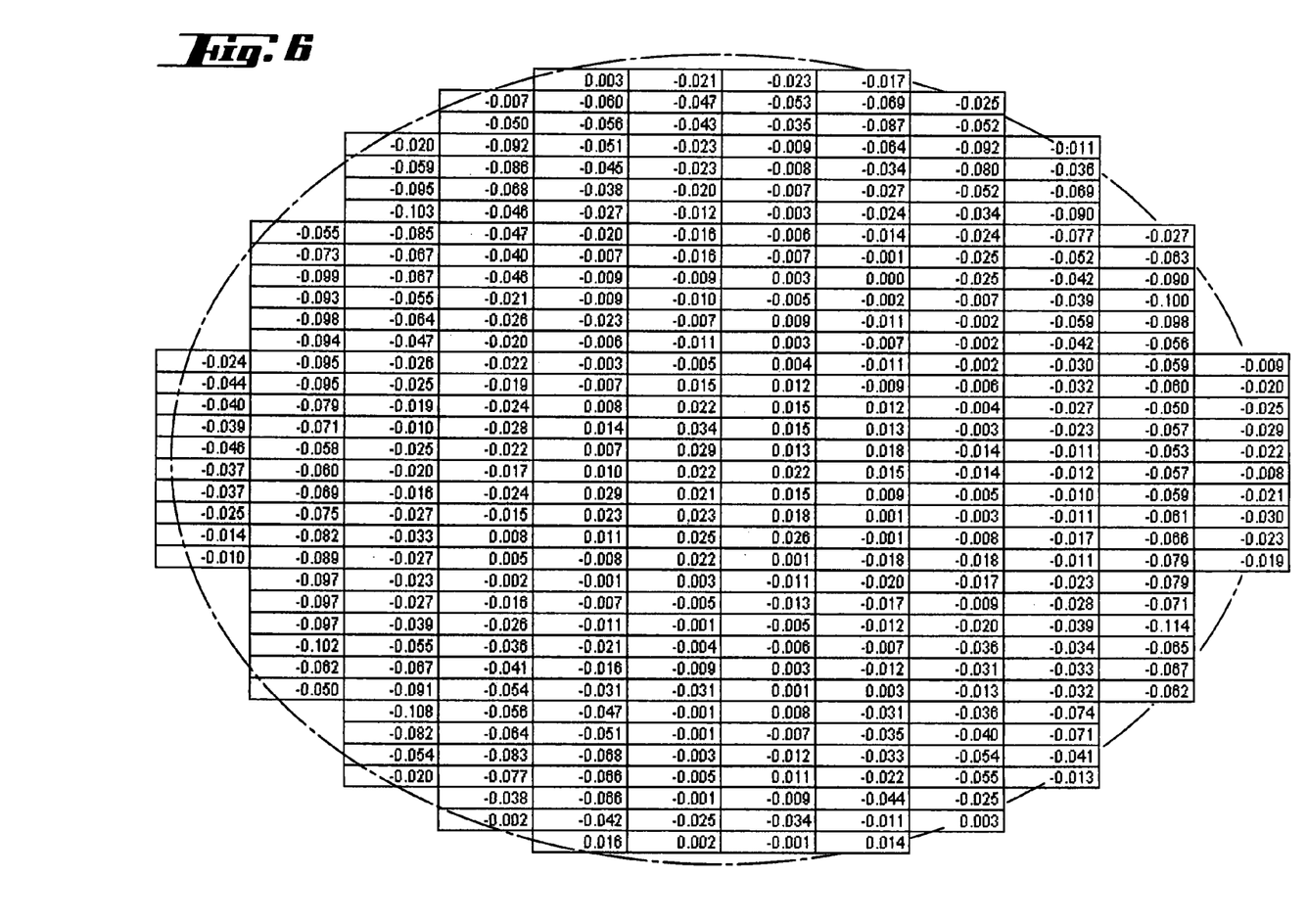
FIG. 6 shows, for each component area on the epitaxially coated silicon wafer, the change in the SBIR values relative to the concavely polished wafer.

FIG. 5 illustrates the thickness profile of the epitaxially coated, CMP-polished silicon wafer as a function of its radius as a line scan, resulting in a global flatness value GBIR of 0.12 μm given an edge exclusion of 2 mm, in other words a significant improvement in comparison with the global flatness of the concavely polished silicon wafer, which has not been possible heretofore in the prior art since in the prior art epitaxial depositions are more likely to lead to deteriorations in the global and local flatnesses of silicon wafers.

FIG. 6 shows, for each component area, the change in the SBIR values of the epitaxially coated silicon wafer in comparison with the concavely polished wafer. Values having a positive sign denote a deterioration, and negative signs an improvement of the SBIR values. An improvement of the local flatness occurs particularly in the edge region of the epitaxially coated silicon wafer, which can be attributed to the leveling of the silicon wafer in its edge region by the pretreatment of said silicon wafer with addition of HCl to the hydrogen atmosphere at a significantly reduced hydrogen flow rate.

While embodiments of the invention have been illustrated and described, it is not intended that these embodiments illustrate and describe all possible forms of the invention. Rather, the words used in the specification are words of description rather than limitation, and it is understood that various changes may be made without departing from the spirit and scope of the invention.

What is claimed is:

1. A method for producing epitaxially coated silicon wafers, comprising:

providing a multiplicity of silicon wafers polished on at least their front sides, and successively and individually coating each wafer in an epitaxy reactor by a procedure comprising placing a silicon wafer on a susceptor in an epitaxy reactor, pretreating the wafer under a hydrogen atmosphere at a first hydrogen flow rate in a first step, and pretreating with addition of an etching medium to the hydrogen atmosphere at a reduced hydrogen flow rate in a second step, subsequently epitaxially coating the wafer on at least its polished front side, and removing the wafer from the epitaxy reactor, wherein an etching treatment of the susceptor with an etching medium is effected after epitaxial coating of one or more wafers, and wherein the epitaxially coated silicon wafers have a global flatness value GBIR of 0.07-0.3 μm relative to an edge exclusion of 2 mm, wherein the first hydrogen flow rate is from about 20-100 slm, and the second hydrogen flow rate is about 0.5 to 10 slm.

2. The method of claim 1, wherein the pretreatments are each effected at least in part within a temperature range of 950 to 1200° C.

3. The method of claim 1, wherein the etching medium added to the hydrogen atmosphere is hydrogen chloride.

4. The method of claim 3, wherein HCL is present in the etching medium in the second step within the range of 5% to 20% by volume.

5. The method of claim 1, wherein the hydrogen flow rate in the first step is 40-60 slm.

6. The method of claim 1, wherein the hydrogen flow rate, during pretreatment with addition of etching medium to the hydrogen atmosphere, is reduced to 0.5-5 slm and the treatment duration is 10-120 s.

7. The method of claim 1, wherein the GBIR is from 0.07 μm to 0.15 μm.

8. The method of claim 1, wherein the epitaxial deposition is effected using trichlorosilane, at a deposition temperature of 1050-1150° C.

9. The method of claim 1, wherein hydrogen chloride being used as the etching medium during the treatment of the susceptor and the etching treatment of the susceptor is effected after 1 to 5 epitaxial depositions.

10. The method of claim 1, wherein the susceptor is coated with silicon after treatment with the etching medium.

11. The method of claim 1, wherein the silicon wafers are wafers made of monocrystalline silicon material, SOI ("silicon-on-insulator") wafers, silicon wafers having strained silicon layers ("strained silicon") or sSOI ("strained silicon-on-insulator") wafers.

12. A method for producing epitaxially coated silicon wafers, comprising:

providing a multiplicity of silicon wafers polished on at least their front sides, and successively and individually coating each wafer in an epitaxy reactor by a procedure comprising placing a silicon wafer on a susceptor in an epitaxy reactor, pretreating the wafer under a hydrogen atmosphere at a first hydrogen flow rate in a first step, and pretreating with addition of an etching medium to the hydrogen atmosphere at a reduced hydrogen flow rate in a second step, subsequently epitaxially coating the wafer on at least its polished front side, and removing the wafer from the epitaxy reactor, wherein an etching treatment of the susceptor with an etching medium is effected after epitaxial coating of one or more wafers, and wherein the epitaxially coated silicon wafers have a global flatness value GBIR of 0.07-0.3 μm relative to an edge exclusion of 2 mm, wherein the first hydrogen flow rate is from about 20-100 slm, and the second hydrogen flow rate is about 0.5 to 10 slm and wherein the epitaxially coated wafer has a global flatness value GBIR of 0.07 μm to 0.3 μm relative to an edge exclusion of 2 mm, the GBIR value measured directly after the epitaxial coating step.

* * * * *